US011462259B2

(12) United States Patent
Kitagawa

(10) Patent No.: US 11,462,259 B2
(45) Date of Patent: Oct. 4, 2022

(54) APPARATUSES AND METHODS FOR PROVIDING POWER RESPONSIVE TO INTERNAL POWER USAGE

(71) Applicant: Micron Technology, Inc., Boise, ID (US)

(72) Inventor: Katsuhiro Kitagawa, Hachioji (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/114,338

(22) Filed: Dec. 7, 2020

(65) Prior Publication Data
US 2022/0180914 A1 Jun. 9, 2022

(51) Int. Cl.
| G11C 5/14 | (2006.01) |
| G11C 11/4074 | (2006.01) |
| G11C 11/4096 | (2006.01) |
| G11C 11/406 | (2006.01) |

(52) U.S. Cl.
CPC ...... *G11C 11/4074* (2013.01); *G11C 11/4096* (2013.01); *G11C 11/40615* (2013.01)

(58) Field of Classification Search
CPC .................. G11C 11/4074; G11C 11/40615
USPC ............................................. 365/227
See application file for complete search history.

(56) References Cited

U.S. PATENT DOCUMENTS

| 2009/0067277 A1* | 3/2009 | Smith ................... G06F 3/0659 |
| | | 365/230.06 |
| 2010/0182867 A1* | 7/2010 | Lee ........................ G11C 5/145 |
| | | 365/226 |

FOREIGN PATENT DOCUMENTS

WO    WO 2012052893    *   4/2012

* cited by examiner

*Primary Examiner* — Huan Hoang
(74) *Attorney, Agent, or Firm* — Dorsey & Whitney LLP

(57) ABSTRACT

Apparatuses and methods for controlling internal current are disclosed herein, An example apparatus includes a semiconductor device including a power node. The semiconductor device receives power as an internal current, and further operates in a first mode and a second mode. The semiconductor device consumes more power in the second mode than in the first mode. The semiconductor device consumes a first portion of the internal current and provides a second portion of the internal current as an external current at the power node during the first mode. The semiconductor device consumes a third portion of the internal current that is greater than the first portion of the internal current during the second mode.

22 Claims, 9 Drawing Sheets

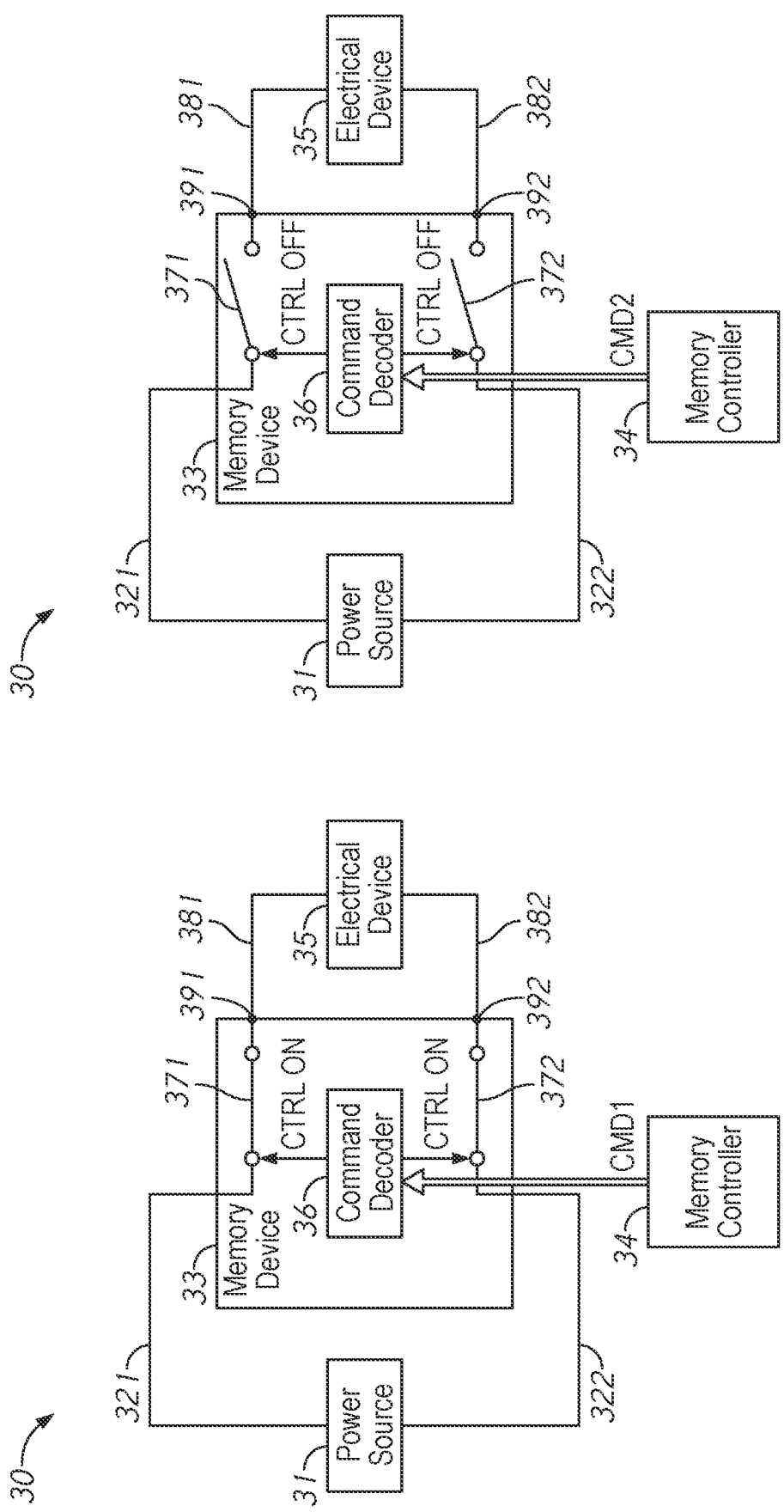

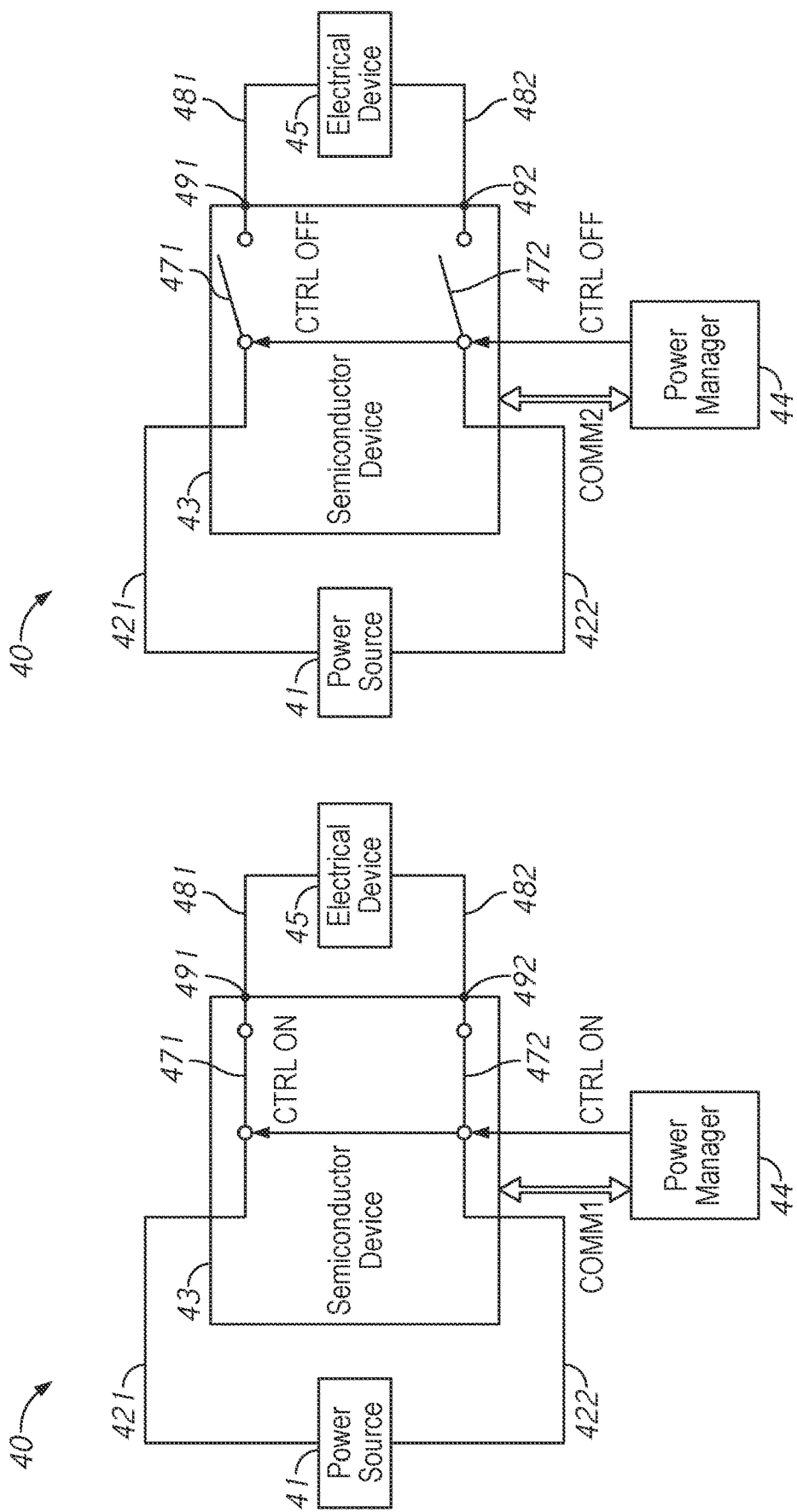

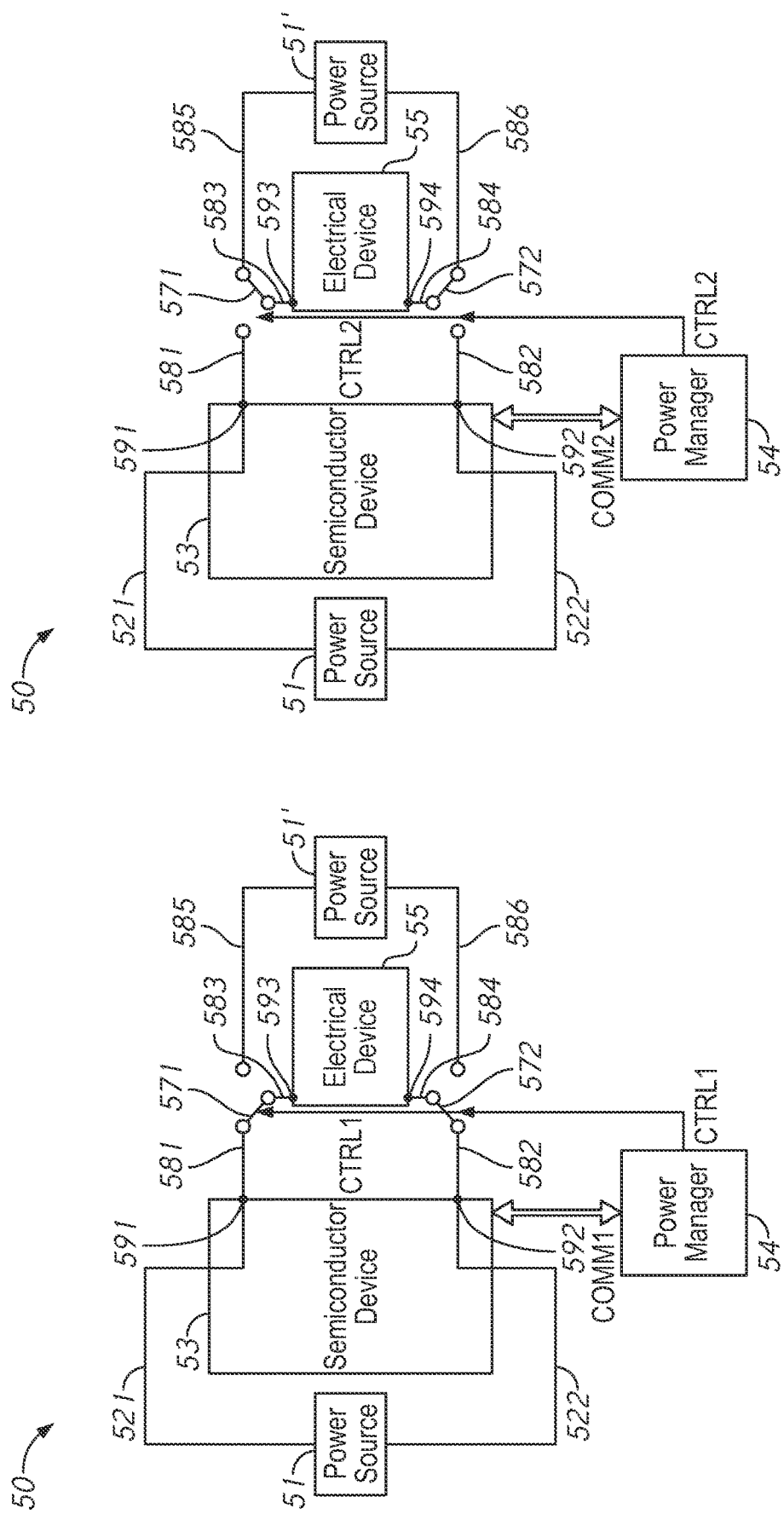

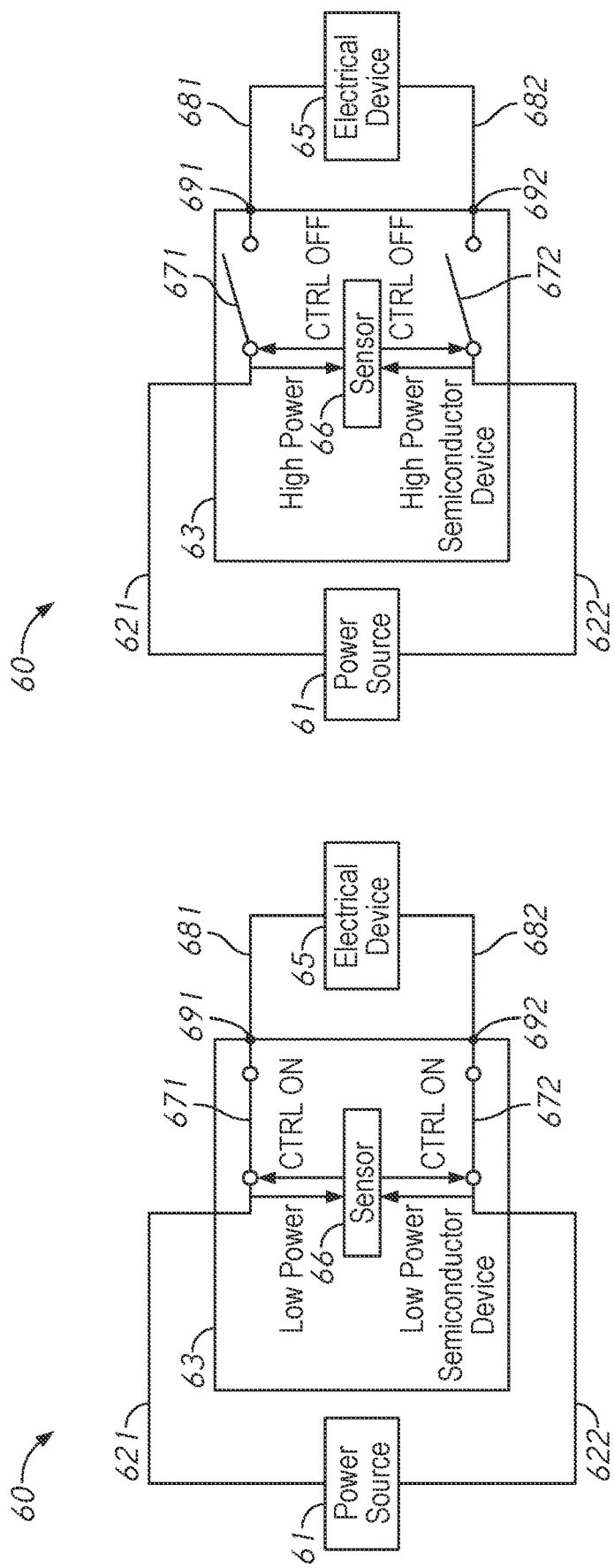

| CMD1 | CMD2 |
|---|---|
| Disable (Deselected) | Enable (Selected) |
| SREF | WR |
| SREF | RD |
| REF | SREF |

APPARATUSES AND METHODS FOR PROVIDING POWER RESPONSIVE TO INTERNAL POWER USAGE

BACKGROUND

Semiconductor devices, such as memory devices and processors receive a power supply from an external power source. Internal currents in the semiconductor devices may depend their internal operations. Wirings function as positive power supply lines and a negative power supply lines between the external power source and these devices. These wirings have inherent resistances or impedances. Due to changes in the internal currents between different internal operations that consume different amounts of power, there are voltage drops in both power supply lines. These voltage drops through the wirings cause inherent delays on clock signals and other timing critical signals.

To prevent these inherent delays, typical implementations have used a voltage regulator or a delay-locked loop (DLL) circuit. The DLL circuit locks a phase between these timing signals, to control the inherent delays of these timing signals. However, another approach may be desired in order to remedy fluctuation of the internal currents and that can be implemented in a simpler manner without requiring a complex DLL circuit.

BRIEF DESCRIPTION OF THE DRAWINGS

FIGS. 3A and 3B are block diagrams of an apparatus including a memory device that includes a command decoder, a memory controller and an electrical device according to an embodiment of the disclosure.

FIGS. 4A and 4B are block diagrams of an apparatus including a semiconductor device, a power manager and an electrical device according to an embodiment of the disclosure.

FIGS. 5A and 5B are block diagrams of an apparatus including a semiconductor device, a power manager and an electrical device according to an embodiment of the disclosure.

FIGS. 6A and 6B are block diagrams of an apparatus including a semiconductor device that includes a sensor, and an electrical device according to an embodiment of the disclosure.

DETAILED DESCRIPTION

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

Embodiments of the disclosure may be used with and/or included an apparatus that includes a semiconductor device. The semiconductor device may be a processor unit such as a central processor unit (CPU), a graphical processor unit (CPU). In sonic embodiments of the disclosure, the semiconductor device may be a memory device. In some embodiments of the disclosure, the memory device may be a dynamic random access memory (DRAM), for example, a double data rate (DDR) synchronous dynamic random-access memory (SDRAM) interface of several generations having high bandwidth of double data rate. In some embodiments of the disclosure, the memory device may be a graphics DDR SDRAM (DDDR) of several generations having less access latency and high bandwidth, or low-power DDR SDRAM (LPDDR) of several generations. In some embodiments of the disclosure, the memory device may be a high bandwidth memory of several generations that is vertically integrated memory, such as three-dimensional stacked SDRAM including a plurality of stacked memory arrays that operates as a single memory device.

Figure 1:
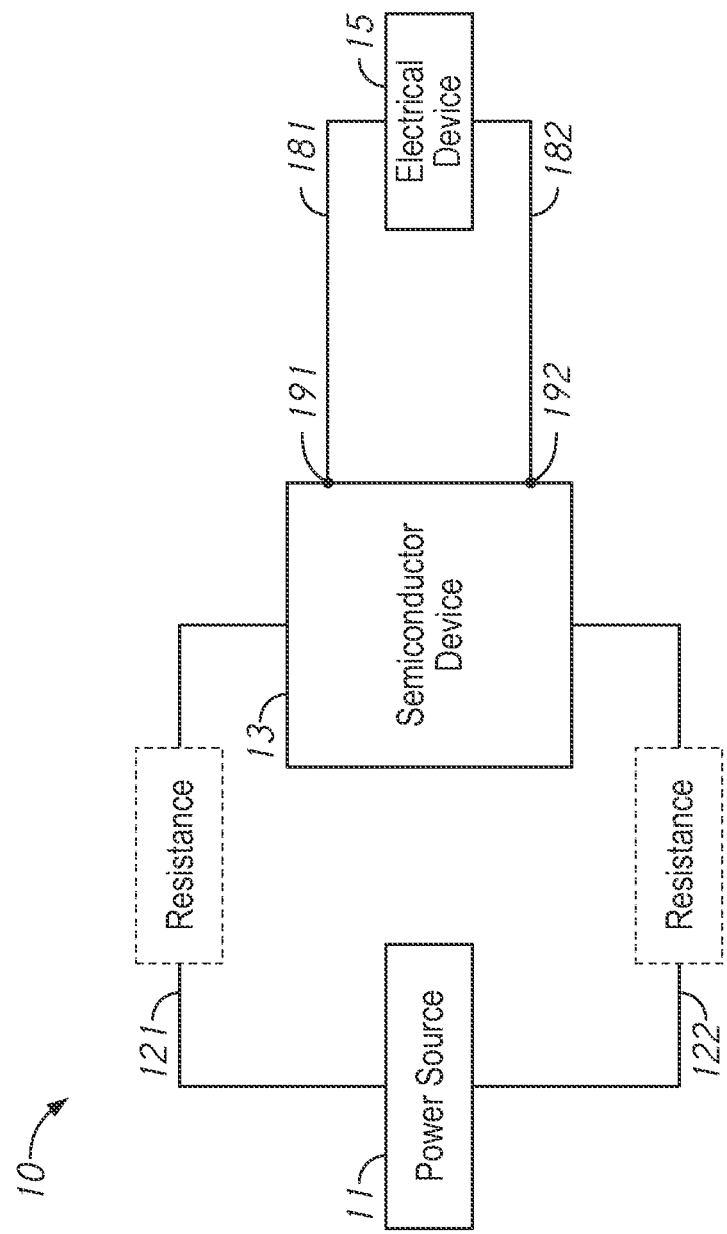
FIG. 1 is a schematic block diagram of an apparatus including a semiconductor device according to an embodiment of the disclosure.

FIG. 1 is a schematic block diagram of an apparatus 10 including a semiconductor device according to an embodiment of the disclosure. The apparatus 10 may be an electronic device that includes one or more devices and components that operate with electric power supply. The apparatus 10 may include a power source 11, a semiconductor device 13, and wirings 121 and 122. Each wiring of the wirings 121 and 122 may have one end coupled to the power source and the other end coupled to the semiconductor device 13. Thus, the wirings 121 and 122 may couple the semiconductor device 13 to the power source 11, and the power source 11 may provide power to the semiconductor device 13 via the wirings 121 and 122. For example, the power source 11 may provide an internal current to the semiconductor device 13 via the wirings 121 and 122. Examples of a power source 11 include a battery that stores power and a power controller that receives external power and provide internal power. The apparatus 10 may further include an electrical device 15 that may be coupled to the semiconductor device 13. In some embodiments, the electrical device 15 may include a power consumer circuit that consumes power. In some embodiments, the electrical device 15 may include a power generator circuit that generates power. The apparatus 10 may also include wirings 181 and 182 that may couple the electrical device 15 to power nodes 191 and 192 of the semiconductor device 13. By providing at least a portion of the internal current as an external current to the electrical device 15 from the power nodes 191 and 192 on the wirings 181 and 182, or not providing the internal current to the electrical device 15 from the power nodes 191 and 192, a load on the power source 11 may be adjusted to stabilize the internal current.

Different operations of the semiconductor device 13 may consume different amount of power. For example, during an active period while the semiconductor device 13 is executing an operation with high power consumption, the semiconductor device 13 may consume more power supplied by the power source 11 via the wirings 121 and 122. On the other hand, during a passive period while the semiconductor device 13 is executing an operation with low power consumption, the semiconductor device 13 may consume less power. During the passive period, the semiconductor device 13 may provide at least a portion of the internal current as an external current to the wirings 181 and 182 at the power nodes 191 and 192. The electrical device 15 may receive the external current from the wirings 181 and 182, and may operate, driven by the external current. Because the semiconductor device 13 and the electrical device 15 together become the load on the power source 11 in the passive period, while the semiconductor device 13 alone is a load for the power source 11 in the active period, the internal current between semiconductor device 13 and the power source 11 may become stable. Even if the wirings 121 and 122 may have resistances, because the internal current may be maintained relatively stable, voltage drops of the wirings 121 and 122 between the power source 11 and the semiconductor device 13 may be substantially the same between the active and passive periods due to the stability of the internal current. Thus, voltage drops at the wirings 121 and 122 may be substantially constant across the operations. Subsequently, a delay amount of inherent delays within the semiconductor device 13 caused by the voltage drops at the wirings 121 and 122 may be stable between the active and passive periods.

In some embodiments of the disclosure, the electrical device 15 may be an electrical device that may operate to achieve the purpose of the apparatus regardless of conditions of the external currents on the wirings 181 and 182. For example, the electrical device 15 may be an electrical device where the timing of receiving the external currents, or the amounts of the external current may not be critical to its operation. In some embodiments of the disclosure, the electrical device 15 may be an electrical device that may radiate heat, such as a fan or a thermoelectric cooler (e.g., a Peltier element). In some embodiments of the disclosure, the electrical device 15 may be an electrical device that may emit light, such as a light-emitting diode (LED). In some embodiments of the disclosure, the electrical device 15 may be an electrical device that may store energy, such as a capacitor or a battery.

Figure 2:
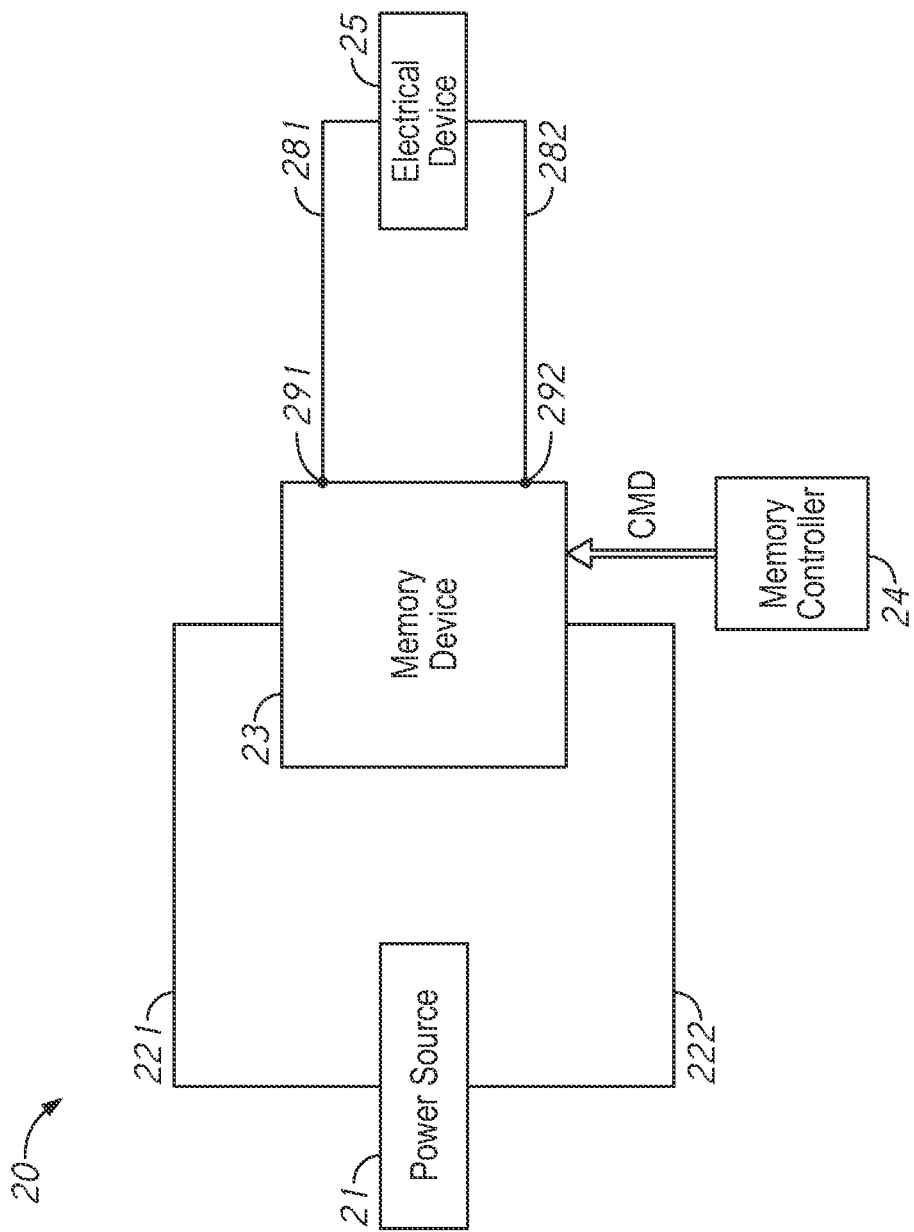
FIG. 2 is a schematic block diagram of an apparatus including a memory device, a memory controller and an electrical device according to an embodiment of the disclosure.

FIG. 2 is a schematic block diagram of an apparatus 20 including a memory device 23, a memory controller 24 and an electrical device 25 according to an embodiment of the disclosure. In some embodiments of the disclosure, the apparatus 20 may be a personal computer (PC), such as a game PC, a desktop PC, a laptop PC or a graphic PC, or a mobile computer. However, the apparatus 20 may not be limited to computers. The apparatus 20 may include a power source 21 that may supply power to the device 23. The apparatus 20 may include wirings 221 and 222 that may couple the semiconductor device 23 to the power source 21. For example, the power source 21 may provide an internal current to the semiconductor device 23 via the wirings 221 and 222. The apparatus 20 may include one or more electrical devices 25 that may be coupled to the memory device 23. The apparatus 20 may also include wirings 281 and 282 that may couple the electrical device 25 to power nodes 291 and 292 of the memory device 23. By providing at least a portion of the internal current as an external current to the electrical device 25 from the power nodes 291 and 292 on the wirings 281 and 282, or not providing the internal current to the electrical device 25 from the power nodes 291 and 292, a load on the power source 21 may be adjusted to stabilize the internal current. For example, the load on the power source 21 may be adjusted to adjust the portion of the internal current as the external current to a greater amount or a less amount.

The memory device 23 may execute different operations which may consume different amounts of power. The memory controller 24 may provide a command CMD to instruct control of an operation of the memory device 23. The memory device 23 may receive the command CMD, and responsive to a command CMD, may execute the operation. For example, during an active period while the memory device 23 is executing a memory access operation with high power consumption, the memory device 23 may consume more power delivered as an internal current supplied by the power source 21 via the wirings 221 and 222. Examples of memory access operations with high power consumption include a read or write operation responsive to a read command or a write command, and/or memory accesses to addresses included in commands that may consume relatively more power. On the other hand, during a passive period while the semiconductor device 23 is executing an operation with low power consumption, the memory device 23 may consume less power delivered as the internal current. Examples of operations with low power consumption includes precharging or memory accesses with addresses that may consume relatively less power. The portion of the internal current used by the memory device 23 during the operation with high power consumption is greater than the portion of the internal current used by the memory device 23 during the operation with low power consumption.

During the passive period, the memory device 23 may provide at least a portion of the internal current as an external current to the wirings 281 and 282. The electrical device 25 may receive the external current from the wirings 281 and 282, and may operate, driven by the external current. Because the memory device 23 and the electrical device 25 together become the load on the power source 21 in the passive period, while the semiconductor device 23 alone or mainly becomes a load for the power source 21 in the active period, the internal current that the memory device 23 may receive from the power source 21 may become stable. Thus, voltage drops at the wirings 221 and 222 may be substantially constant across the operations. Subsequently, a delay amount of inherent delays within the semiconductor device 13 caused by the voltage drops at the wirings 221 and 222 may be stable across the operations.

In some embodiments of the disclosure, the electrical device 25 may be any electrical device that may receive the external current from the wirings 281 and 282, The electrical device 25 may further consume electric power by operating to achieve the purpose of the electrical device using the external current received. The electrical device 25 may be an electrical device where the timings of receiving the external current, or the amount of the external current may not be critical to the electrical device 25. In some embodiments of the disclosure, the electrical device 25 may radiate heat, such as a fan or a thermoelectric cooler. In some embodiments of the disclosure, the electrical device 25 may emit light, such as a light-emitting diode (LED). In some embodiments of the disclosure, the electrical device 25 may store energy, such as a capacitor or a battery.

FIGS. 3A and 3B are block diagrams of an apparatus 30 including a memory device 33 that includes a command decoder 36, a memory controller 34 and an electrical device 35 according to an embodiment of the disclosure. The apparatus 30 may be the apparatus 20 in FIG. 2, and the memory device 33 may be the memory device 23 in FIG. 2. In the memory device 33, the command decoder 36 may receive a command from the memory controller 34 and control internal circuits (not shown) according to an operation instructed by the command. The memory device 33 may receive an internal current from a power source 31 via wirings 321 and 322. The memory device 33 may provide an external current from power nodes 391 and 392 to wirings 381 and 382 that are coupled to the electrical device 35. The memory device 33 may further include switches 371 and 372. The switch 371 may connect the wiring 321 to the power node 391 to provide power on the wiring 321 to the power node 391, and the switch 372 may connect the wiring 322 to the power node 392 to provide power on the wiring 322 to the power node 392, respectively. The apparatus 30 may include the wirings 381 and 382 that may couple the electrical device 35 to power nodes 391 and 392 of the memory device 33. In some embodiments, the command decoder 36 acts as a power manager. The command decoder 36 may control turning on and off of the switches 371 and 372.

In one example shown in FIG. 3A, the memory controller 34 may provide a first command CMD1 for a memory operation with low power consumption. For example, the first command CMD1 may be a precharge command or a self-refresh command. In the memory device 33, the command decoder 36 may receive the first command CMD1, and responsive to the first command CMD1, the command decoder 36 may control the internal circuits to execute an operation indicated in the first command CMD1. For example, in a precharge operation, the memory device 33 may control the circuits in a manner to precharge bit lines to be accessed to a precharge voltage. Responsive to the first command CMD1, the command decoder 36 may further provide a control signal in an active state (CTRL ON) to the switches 371 and 372. Responsive to the control signal in the active state, the switch 371 may connect the wiring 321 to the wiring 381 coupled to the power node 391, and the switch 372 may connect the wiring 322 to the wiring 382 coupled to the power node 392, respectively. The internal current from the power source 31 on the wirings 321 and 322 may be further provided as an external current on the wirings 381 and 382 to the electrical device 35. Thus, the power provided as the internal current to the memory device 33 may be used for the operations in the memory device 33, such as the precharge or self-refresh, as well as for operations executed by the electrical device 35. In this manner, the command decoder 36 may enable providing the external current to the electrical device 35 responsive to the first command CMD1.

In another example shown in FIG. 3B, the memory controller 34 may provide a second command CMD2 for a memory operation with high power consumption. For example, the second command CMD2 may be one of various types of read commands and/or write commands. In the memory device 33, the command decoder 36 may receive the second command CMD2, and responsive to the second command CMD2, the command decoder 36 may control the internal circuits, such as a row decoder (not shown) and a column decoder (not shown) to execute an operation indicated in the second command CMD2. For example, the row decoder may activate a row to be accessed, such as to be read or to be written, by driving a word line corresponding to the row to a high voltage level. Responsive to the second command CMD2, the command decoder 36 may further provide the control signal in an inactive state (CTRL OFF) to the switches 371 and 372. Responsive to the control signal in the inactive state, the switch 371 may disconnect the power node 391 coupled to the wiring 381 from the wiring 321, and the switch 372 may disconnect the power node 392 coupled to the wiring 382 from the wiring 322, respectively. Thus, the power provided as the internal current from the power source 31 to the memory device 33 via the wirings 321 and 322 may be used for the operations in the memory device 33, such as the read or write operations. However the external current may not be provided to the electrical device 35. In this manner, the command decoder 36 may disable providing the external current to the electrical device 35 responsive to the second command CMD2.

In the manner described above, the command decoder 36 may enable or disable providing the external current to the electrical device 35 responsive to the first command CMD1 and the second command CMD2 from the memory controller 34. As discussed earlier referring to FIG. 2, by providing or not providing at least a portion of the internal current depending on operations of different amounts of power consumption, a load on the power source 31 may be adjusted. The load on the power source 31 may be adjusted to adjust the portion of the internal current as the external current. The portion of the internal current used by the memory device 33 during the operation with high power consumption is greater than the portion of the internal current used by the memory device 33 during the operation with low power consumption. As a result, the internal current may be maintained stable, without substantial fluctuation, for different lower power consumption and high power consumption operations instructed by the first command CMD1 and the second command CMD2.

FIGS. 4A and 4B are block diagrams of an apparatus 40 including a semiconductor device 43, a power manager 44 and an electrical device 45 according to an embodiment of the disclosure. In one embodiment, the apparatus 40 may be the apparatus 20 in FIG. 2, the semiconductor device 43 may be the memory device 23 in FIG. 2, and the power manager 44 may be the memory controller 24 in FIG. 2. However, the combination of the apparatus 40, the semiconductor device 43 and the power manager 44 may not be limited to the apparatus 20, the memory device 23 and the memory controller 24. In another embodiment, the semiconductor device 43 may be another type of semiconductor device, such as a processor, etc.

The semiconductor device 43 may be coupled to a power source 41. The power source 41 may supply power as an internal current on wirings 421 and 422. The semiconductor device 43 may receive the internal current from the power source 41 on the wirings 421 and 422. The semiconductor device 43 may provide an external current from power nodes 491 and 492 to wirings 481 and 482 that are coupled to the electrical device 45, The semiconductor device 43 may further include switches 471 and 472. While the switch 471 is turned on, the switch 471 may connect the wiring 421 to a power node 491 to provide power on the wiring 481. While the switch 471 is turned on, the switch 472 may connect the wiring 422 to a power node 492 to provide power on the wiring 482, respectively. In one embodiment, the power manager 44 may control turning on and off of the switches 471 and 472.

In one example shown in FIG. 4A, the power manager 44 may provide or receive a first type of communication COMM1 related to a mode with low power consumption. The first type of communication COMM1 from the power manager may instruct of the semiconductor device 43 to perform an operation which results in the mode with low power consumption. For example, the first type of communication COMM1 may be a precharge command or a self-refresh command from a memory controller to a memory device. Alternatively, the first type of communication COMM1 may be from the semiconductor device 43, indicative of a status of the semiconductor device 43, such as a CPU, being in an idling mode. Responsive to the first type of communication COMM1, the power manager 44 may further provide a control signal in an active state (CTRL ON) to the switches 471 and 472. Responsive to the control signal in the active state, the switch 471 may connect the wiring 421 to the wiring 481, and the switch 472 may connect the wiring 422 to the wiring 482, respectively. The internal current received from the power source 41 via the wirings 421 and 422 may be further provided as the external current to the electrical device 45. Thus, the power provided as the internal current to the semiconductor device 43 may be used for the internal operations in the semiconductor device 43, such as the precharge or self-refresh, as well as operations executed by the electrical device 45. In this manner, the power manager 44 may enable providing the external current to the electrical device 45 responsive to the first type of communication COMM1.

In another example shown in FIG. 4B, the power manager 44 may provide or receive a second type of communication COMM2 related to a mode with high power consumption. The second type of communication COMM2 from the power manager 44 may instruct the semiconductor device 43 to perform an operation which results in the mode with high power consumption. For example, the second type of communication COMM2 may be one of various types of read commands and write commands from a memory controller to a memory device. Alternatively, the second type of communication COMM2 may be from the semiconductor device 43, indicative of a status of the semiconductor device 43, such as the CPU, being in a busy mode. Responsive to the second type of communication COMM2, the power manager 44 may further provide the control signal in an inactive state (CTRL OFF) to the switches 471 and 472. Responsive to the control signal in the inactive state, the switch 471 may disconnect the power node 491 from the wiring 421, and the switch 472 may disconnect the power node 492 from the wiring 422, respectively. Thus, the power provided as the internal current to the semiconductor device 43 from the power source 41 via the wirings 421 and 422 may be used by very active operations in the semiconductor device 43, such as the read or write operations. However, an external current may not be provided to the electrical device 45. In this manner, the power manager 44 may disable providing the external current to the electrical device 45 responsive to the second type of communication COMM2.

In the manner described above, the power manager 44 may enable or disable providing the external current from the semiconductor device 43 to the electrical device 45 responsive to the first type of communication COMM1 and the second type of communication COMM2 between the semiconductor device 43 and the power manager 44. As discussed earlier referring to FIG. 2, by providing or not providing at least a portion of the internal current depending on operations of different amounts of power consumption, a load on the power source 41 may be adjusted. Alternatively, by adjusting the portion of the internal current as the external current, the load on the power source 41 may also be adjusted. The portion of the internal current used by the semiconductor device 43 during the mode with high power consumption is greater than the portion of the internal current used by the semiconductor device 43 during the mode with low power consumption. Therefore, the internal current between the power source 41 and the semiconductor device 43 on the wirings 421 and 422 may be stable, without substantial fluctuation, for different lower power consumption and high power consumption operations executed by the semiconductor device 43 across the modes with low and high power consumptions, during the first type of communication COMM1 and the second type of communication COMM2.

FIGS. 5A and 5B are block diagrams of an apparatus including a semiconductor device 53, a power manager 54 and an electrical device 55 according to an embodiment of the disclosure. In one embodiment, the apparatus 50 may be the apparatus 20 in FIG. 2, the semiconductor device 53 may be the memory device 53 in FIG. 2, and the power manager 54 may be the memory controller 24 in FIG. 2. However, the combination of the apparatus 50, the semiconductor device 53 and the power manager 54 may not be limited to the apparatus 20, the memory device 23 and the memory controller 24. In another embodiment, the semiconductor device 53 may be another type of semiconductor device, such as a processor, etc.

The semiconductor device 53 may be coupled to a power source 51. The power source 51 may supply power as internal currents on wirings 521 and 522. The internal currents on the wirings 521 and 522 may be provided as external currents from power nodes 591 and 592 of the semiconductor device 53 on wirings 581 and 582. In one embodiment, the apparatus 50 may further include a power source 51' and wirings 585 and 586 coupled to the power source 51'. The apparatus 10 may also include switches 571 and 572. The switches 571 and 572 may connect wirings 583 and 584 coupled to power input nodes 593 and 594 of the electrical device 55 to wirings 581 and 582 coupled to the power nodes 591 and 592 of the semiconductor device 53. Alternatively, the switches 571 and 572 may connect the wirings 583 and 584 to the wirings 585 and 586 coupled to the power source 51', respectively.

In one example shown in FIG. 5A, the power manager 54 may provide or receive a first type of communication COMM1 related to a first mode with low power consumption. The first type of communication COMM1 from the power manager 54 may instruct the semiconductor device 53 to perform an operation that results n low power consumption. For example, the first type of communication COMM1 may be a precharge command or a self-refresh command from a memory controller to a memory device. Alternatively, the first type of communication COMM1 from the semiconductor device 53 may be indicative of a status of the semiconductor device 53, such as a CPU, being in an idling mode from the semiconductor device 53. Responsive to the first type of communication COMM1, the power manager 54 may further provide a control signal indicative of the first mode (CTRL1) to the switches 571 and 572. Responsive to the control signal CTRL1, the switch 571 may connect the wiring 583 to the wiring 581, and the switch 572 may connect the wiring 584 to the wiring 582, respectively. The internal current received from the power source 51 via the wirings 521 and 522 may be further provided as the external current via the wirings 581 and 583, 582 and 584, to the electrical device 55, by the switches 571 and 572. Thus, the power provided as the internal current to the semiconductor device 53 may be used for the internal operations in the semiconductor device 53, such as the precharge or self-refresh, as well as operations executed by the electrical device 55. In this manner, the power manager 54 may enable providing the external current to the electrical device 55 responsive to the first type of communication COMM1.

In another example shown in FIG. 5B, the power manager 54 may provide or receive a second type of communication COMM2 related to a second mode with high power consumption. The second type of communication COM2 from the power manager 54 instructs the semiconductor device 53 to perform an operation which results in the second mode with high power consumption. For example, the second type of communication COMM2 may be one of various types of read commands and write commands from a memory controller to a memory device. Alternatively, the second type of communication COMM2 from the semiconductor device 53 may be indicative of a status of the semiconductor device 53, such as the CPU, being in a busy mode. Responsive to the second type of communication COMM2, the power manager 54 may further provide the control signal indicative of the second mode (CTRL2) to the switches 571 and 572. Responsive to the control signal CTRL2, the switch 571 may connect the wiring 583 to the wiring 585, and the switch 572 may connect the wiring 584 to the wiring 586, respectively. Thus, the power provided as the internal current to the semiconductor device 53 from the power source 51 via the wirings 521 and 522 may be used by very active operations in the semiconductor device 53, such as the read or write operations. However, the internal current on the wirings 581 and 582 may not be provided to the electrical device 55, and another external current from the power source 51' the on the wirings 585 and 586 may be provided to the electrical device 55 instead. In this manner, the power manager 54 may disable providing the internal current to the electrical device 55 and may instead enable providing the external current to the electrical device 55, responsive to the second type of communication COMM2.

As described above, the power manager 54 may enable or disable providing the internal current from the semiconductor device 53 to the electrical device 55 responsive to the first type of communication COMM1 or the second type of communication COMM2 between the semiconductor device 53 and the power manager 54, respectively. The power manager 54 may further enable providing the other external current on the wirings 585 and 586 from the power source 51' to the electrical device 55 responsive to the second type of communication COMM2 between the semiconductor device 53 and the power manager 54.

While the greater portion of the internal current is used by the semiconductor device 53 during the operation with high power consumption, the electrical device 55 may be provided the other external current from the power source 51'. While the less portion of the internal current is used by the semiconductor device during the operation with low power consumption, the electrical device 55 may be provided at least a portion of the internal current. Regardless of whether a portion of the internal current is provided from the semiconductor device 53, the electrical device 55 may be provided with a stable power supply across the operations of the high and low power consumption by the semiconductor device 53. As discussed earlier referring to FIG. 2, depending on operations of different amounts of power consumption of the semiconductor device 53, a load on the power source 51 may be adjusted to adjust the portion of the internal current as the external current. The portion of the internal current used by the semiconductor device 53 during the operation with high power consumption is greater than the portion of the internal current used by the semiconductor device 53 during the operation with low power consumption. Therefore, the internal current between the power source 51 and the semiconductor device 53 on the wirings 521 and 522 may be stable, without substantial fluctuation, for different lower power consumption and high power consumption operations executed by the semiconductor device 53 across the first and second modes.

FIGS. 6A and 6B are block diagrams of an apparatus 60 including a semiconductor device 63 that includes a sensor 66, and an electrical device 65 according to an embodiment of the disclosure. In one embodiment, the apparatus 60 may be the apparatus 20 in FIG. 2, and the semiconductor device 63 may be the memory device 23 in FIG. 2. In another embodiment, the semiconductor device 53 may be another type of semiconductor device, such as a processor, etc.

The semiconductor device 63 may receive an internal current from a power source 61 via wirings 621 and 622. The semiconductor device 63 may provide an external current to wirings 681 and 682 that are coupled to the electrical device 65. The semiconductor device 63 may further include switches 671 and 672. The switch 671 may connect the wiring 621 to a power node 691 coupled to the wiring 681, and the switch 672 may connect the wiring 622 to a power node 692 coupled to the wiring 682, respectively. In one embodiment, the sensor 66 acts as a power manager. The sensor 66 may control turning on and off of the switches 671 and 672.

In one example shown in FIG. 6A, the sensor 66 may detect increase in the internal current on the wirings 621 and 622 indicative of low power consumption within the semiconductor device 63. In some embodiments, the sensor 66 may be an electric current sensor. The sensor 66 may have a threshold to determine the increase in the internal current. When the internal current is greater than the threshold, the sensor 66 may detect a low power consumption mode. In some embodiments, the sensor 66 may be a voltage sensor. The sensor 66 may have a reference voltage independent from an externally supplied voltage. The sensor 66 may compare a voltage between the wirings 621 and 622 divided by a natural number with the reference voltage to detect a low power consumption mode.

Responsive to the detected increase in the internal current indicative of low power consumption within the semiconductor device 63, the sensor 66 may provide a control signal in an active state (CTRL ON) to the switches 671 and 672. Responsive to the control signal in the active state, the switch 671 may connect the wiring 621 to the power node 691 coupled to the wiring 681, and the switch 672 may connect the wiring 622 to the power node 692 coupled to the wiring 682, respectively. The internal current from the power source 61 on the wirings 621 and 622 may be further provided as an external current on the wirings 681 and 682 to the electrical device 65. Thus, the power provided as the internal current to the semiconductor device 63 may be used for the operations in the semiconductor device 63, as well as for operations executed by the electrical device 65. In this manner, the sensor 66 may enable providing the external current to the electrical device 65 responsive to the detected current indicative of low power consumption in the semiconductor device 63.

In another example shown in FIG. 6B, the sensor 66 may detect decrease in the internal current on the wirings 621 and 622 indicative of high power consumption within the semiconductor device 63. For example, the sensor 66 may have another threshold to determine the decrease in the internal current. When the internal current is less than the other threshold, the sensor 66 may detect a high power consumption mode. Responsive to the detected decrease in the internal current indicative of high power consumption within the semiconductor device 63, the sensor 66 may provide the control signal in an inactive state (CTRL OFF) to the switches 671 and 672. Responsive to the control signal in the inactive state, the switch 671 may disconnect the wiring 681 from the wiring 621, and the switch 672 may disconnect the wiring 682 from the wiring 622, respectively. Thus, the power provided as the internal current from the power source 61 to the semiconductor device 63 via the wirings 621 and 622 may be consumed for the operations in the semiconductor device 63. However, the external current may not be provided to the electrical device 65. In this manner, the sensor 66 may disable providing the external current to the electrical device 65 responsive to the detected current indicative of high power consumption in the semiconductor device 63.

In the manner described above, the sensor 66 may enable or disable providing the external current to the electrical device 65 responsive to the level of the detected internal current by the sensor 66. As discussed earlier referring to FIG. 2, by providing or not providing at least a portion of the internal current depending on different amounts of power consumption internally detected, a load on the power source 61 may be adjusted. As a result, the internal current may be maintained stable, without substantial fluctuation, for different lower power consumption and high power consumption operations within the semiconductor device 63, regardless of the amount of power consumption.

In the example described above, the threshold to determine the increase in the internal current and the other threshold to determine the decrease in the internal current are different current amounts. However, these thresholds may be the same current amount.

Figures 7A, 7B:
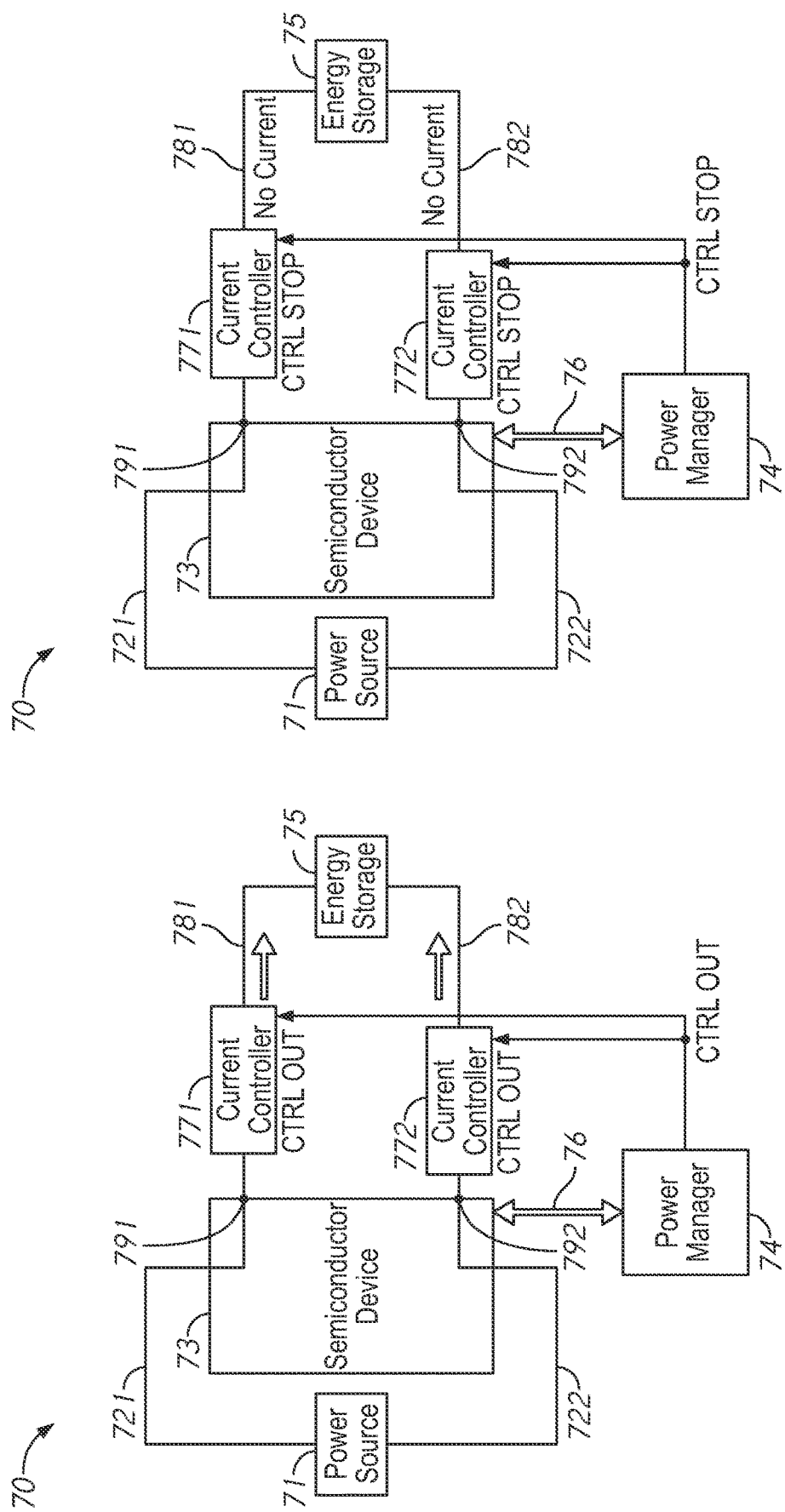
FIGS. 7A, 7B and 7C are block diagrams of an apparatus including a semiconductor device, a power manager and energy storage according to an embodiment of the disclosure.
Figure 7C:
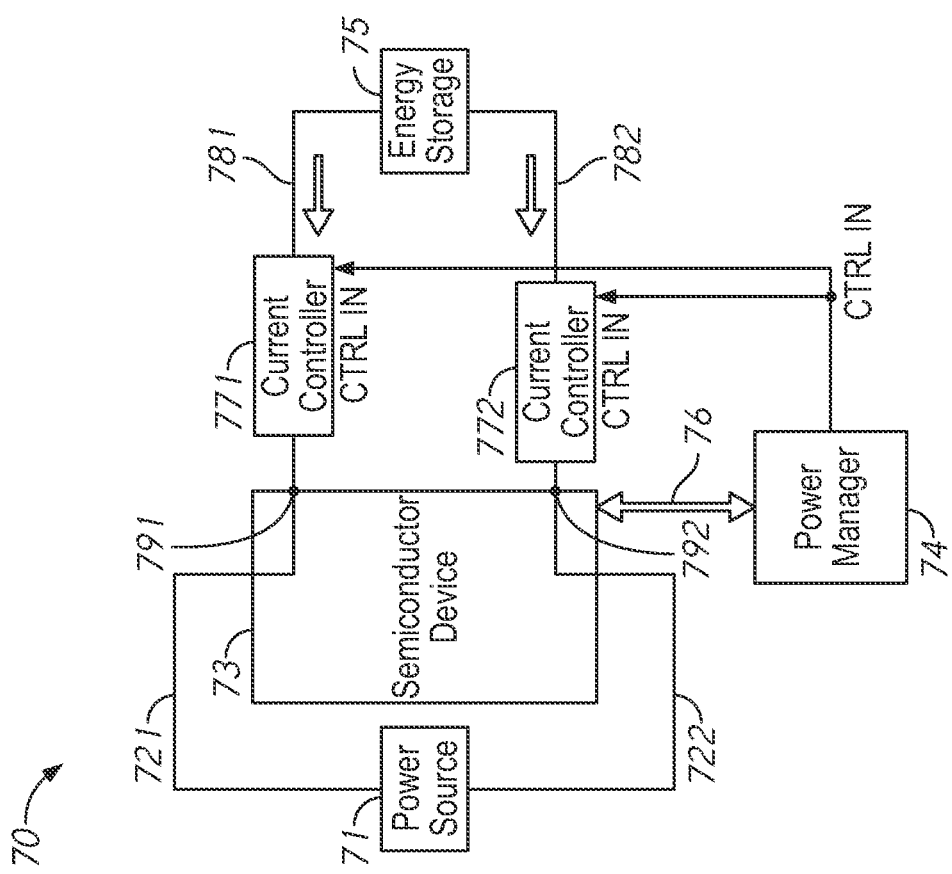

FIGS. 7A, 7B and 7C are block diagrams of an apparatus 70 including a semiconductor device 73, a power manager 74 and energy storage 75 according to an embodiment of the disclosure. In one embodiment, the apparatus 70 may be the apparatus 20 in FIG. 2, and the semiconductor device 73 may be the memory device 23 in FIG. 2, In another embodiment, the semiconductor device 73 may be another type of semiconductor device, such as a processor, etc. In one embodiment, the energy storage may be a capacitor. In another embodiment, the energy storage may be a battery. However, the energy storage 75 is not limited to a capacitor or a battery.

The semiconductor device 73 may be coupled to a power source 71. The power source 71 may supply power as internal currents on wirings 721 and 722. The semiconductor device 73 may receive the internal currents on the wirings 721 and 722 from the power source 71. The energy storage 75 may receive an external current from the semiconductor device 73 on wirings 781 and 782 that are coupled to the energy storage 75 while the semiconductor device 73 is consuming less power in a low power consumption mode. The energy storage 75 may not receive or provide any external current on the wirings 781 and 782 while the semiconductor device 73 is consuming high power provided by the internal currents from the power source 71 in a high power consumption mode. Furthermore, the energy storage 75 may provide an external current to the semiconductor device 73 on the wirings 781 and 782 while the semiconductor device 73 is consuming excessive power, which is more than what the power source 71 can provide, in an excess power consumption mode. In one embodiment, an apparatus 70 may be configured to operate in the low power consumption mode and the high power consumption mode. In another embodiment, an apparatus 70 may be further configured to operate in the excess power consumption mode, in addition to the low power consumption mode and the high power consumption mode. The power manager 74 may provide a control signal related to one of the power consumption modes listed above, to control power supply between the semiconductor device 73 and the energy storage 75.

The apparatus 70 may further include current controllers 771 and 772. In some embodiments, the current controllers 771 and 772 may act as switches. The current controller 771 may connect the wiring 781 to a power node 791 of the semiconductor device 73, which is coupled to the wiring 721 in order to provide the internal current on the wiring 721 as the external current on the wiring 781 to the energy storage 75 during the low power consumption mode. The current controller 771 may disconnect the wiring 781 from the power node 791 of the semiconductor device 73, which is coupled to the wiring 721 in order to stop providing an external current on the wiring 781 during the high power consumption mode. The current controller 771 may connect the wiring 781 to the power node 791 of the semiconductor device coupled to the wiring 721 in a manner to provide an external current from the energy storage 75 to the semiconductor device 73, for example, during the excess power consumption mode. Similarly, the current controller 772 may connect the wiring 782 to a power node 792 of the semiconductor device 73 coupled to the wiring 722 in order to provide the internal current on the wiring 722 as the external current on the wiring 782 to the energy storage 75 during the low power consumption mode. The current controller 772 may disconnect the wiring 782 from the power node 792 of the semiconductor device 73 coupled to the wiring 722 in order to stop providing an external current on the wiring 782 during the high power consumption mode. The current controller 772 may connect the wiring 782 to the power node 792 of the semiconductor device that is coupled to the wiring 722 during the excess power consumption mode. Thus, the current controller 772 may provide an external current from the energy storage 75 to the semiconductor device 73, for example, during the excess power consumption mode.

In one example shown in FIG. 7A, the power manager 74 may provide or receive a first type of communication COMM1 related to a low power consumption mode on a communication path 76. The first type of communication COMM1 from the power manager 74 may instruct the semiconductor device 73 to perform an operation which results in the low power consumption mode. For example, the first type of communication COMM1 may be a precharge command or a self-refresh command from a memory controller to a memory device. Alternatively, the first type of communication COMM1 may be from the semiconductor device 73, indicative of a status of the semiconductor device 73, such as a CPU, being in an idling mode. Responsive to the first type of communication COMM1, the power manager 74 may further provide a control signal indicative of the low power consumption mode (CTRL OUT) to the current controllers 771 and 772. Responsive to the control signal CTRL OUT, the current controllers 771 and 772 may connect the wirings 781 and 782 to the power nodes 791 and 792, respectively and provide the internal current on the wirings 721 and 722 as the external current on the wirings 781 and 782. The internal current received from the power source 71 via the wirings 721 and 722 may be further provided as the external current via the wirings 781 and 782 to the energy storage 75 through the current controllers 771 and 772. Thus, the power provided as the internal current to the semiconductor device 73 may be used for the internal operations in the semiconductor device 73, such as the precharge or self-refresh, as well as for electrically charging the energy storage 75. In this manner, the power manager 74 may enable providing the internal current to the energy storage 75 during the low power consumption mode responsive to the first type of communication COMM1.

In another example shown in FIG. 7B, the power manager 74 may provide or receive a second type of communication COMM2 related to a high power consumption mode on the communication path 76. The second type of communication COMM2 from the power manager 74 instructs the semiconductor device 73 to perform an operation which results in the high power consumption mode. For example, the second type of communication COMM2 may be one of various types of read commands and write commands from a memory controller to a memory device. Alternatively, the second type of communication COMM2 may be from the semiconductor device 73, indicative of a status of the semiconductor device 73, such as the CPU, being in a moderately busy mode. Responsive to the second type of communication COMM2, the power manager 74 may further provide the control signal indicative of the high power consumption mode (CTRL STOP) to the current controllers 771 and 772. Responsive to the control signal CTRL STOP, the current controllers 771 and 772 may disconnect the wirings 781 and 782 from the power nodes 791 and 792, respectively. Thus, the power provided as the internal current to the semiconductor device 73 from the power source 71 via the wirings 721 and 722 may be consumed by very active operations in the semiconductor device 73, such as the read or write operations. However, the internal current on the wirings 721 and 722 may not be provided as the external current on the wirings 781 and 782 to the energy storage 75. In this manner, the power manager 74 may disable or stop providing the internal current to the energy storage 75 responsive to the second type of communication COMM2.

In another example shown in FIG. 7C, the power manager 74 may provide or receive a third type of communication COMM3 related to an excess power consumption mode on the communication path 76. The third type of communication COMM3 from the power manager 74 instructs the semiconductor device 73 to perform an operation which results in the excess power consumption mode. Alternatively, the third type of communication COMM1 may be from the semiconductor device 73, indicative of a status of the semiconductor device 73, such as a CPU, being extremely busy with operations. Responsive to the third type of communication COMM3, the power manager 74 may further provide a control signal indicative of the excess power consumption mode (CTRL IN) to the current controllers 771 and 772. Responsive to the control signal CTRL IN, the current controllers 771 and 772 may connect the wirings 781 and 782 to the power nodes 791 and 792 respectively, to provide the external current on the wirings 781 and 782 to the power nodes 791 and 792. Thus, the external current received from the energy storage 75 via the wirings 781 and 782 may be provided to the semiconductor device 73 through the current controllers 771 and 772. Thus, the semiconductor device 73 may use the internal current and the external current for the internal operations in the semiconductor device 73 in the excess power consumption mode. In this manner, the power manager 74 may enable providing the external current from the energy storage 75 to the semiconductor device 73 during the excess power consumption mode responsive to the third type of communication COMM3.

As described above, the power manager 74 may enable or disable providing the internal current from the semiconductor device 73 to the energy storage 75 responsive to the first type of communication COMM1 or the second type of communication COMM2 between the semiconductor device 73 and the power manager 74. The power manager 74 may further enable providing the external current on the wirings 781 and 782 from the energy storage 75 to the semiconductor device 73 responsive to the third type of communication COMM3 between the semiconductor device 73 and the power manager 74. Therefore, the internal current between the power source 71 and the semiconductor device 73 on the wirings 721 and 722 may be stable, without substantial fluctuation, for different lower power consumption and high power consumption operations executed by the semiconductor device 73 across different power consumption modes, and extra power stored during the low power consumption mode may be used when the semiconductor device 73 may need extra power in the excess power consumption mode.

Figures 8A, 8B:
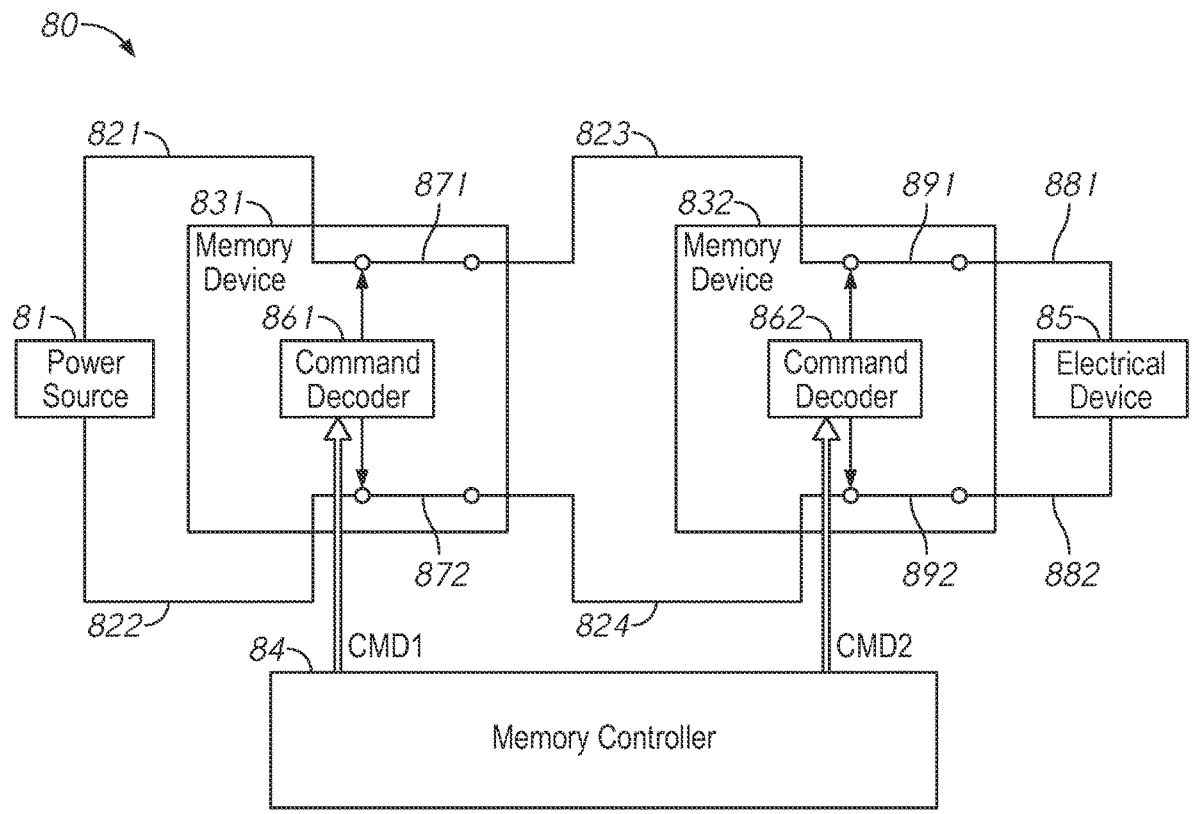
FIG. 8A is a block diagram of an apparatus including memory devices that include command decoders, a memory controller and an electrical device according to an embodiment of the disclosure.
FIG. 8B is a table of commands from the memory controller to the command decoders in FIG. 8A, in accordance with an embodiment of the present disclosure.

FIG. 8A is a block diagram of an apparatus 80 including memory devices 831 and 832 that include command decoders 861 and 862 respectively, a memory controller 84 and an electrical device 85 according to an embodiment of the disclosure. FIG. 8B is a table of commands CMD1 and CMD2 from the memory controller 84 to the command decoders 861 and 862 in FIG. 8A, in accordance with an embodiment of the present disclosure. The memory controller 84 may provide the commands CMD1 and CMD2 to the memory devices 831 and 832, respectively. In the memory device 831, the command decoder 861 may receive the command CMD1 from the memory controller 84 and control internal circuits (not shown) according to an operation instructed by the command CMD1. The memory device 831 may receive an internal current from a power source 81 via wirings 821 and 822. The memory device 83 may provide an external current to wirings 823 and 824 that are coupled to the memory device 832. The memory device 831 may further include switches 871 and 872. The switch 871 may connect the wiring 821 to the wiring 823, and the switch 872 may connect the wiring 822 to the wiring 824, respectively to provide at least a portion of the internal current on the wirings 821 and 822 to the wirings 823 and 824. In one embodiment, the command decoder 861 may control turning on and off of the switches 871 and 872. Similarly, in the memory device 832, the command decoder 862 may receive the command CMD2 from the memory controller 84 and control internal circuits (not shown) according to an operation instructed by the command CMD1. The memory device 832 may receive the portion of internal current from the memory device 831 via wirings 823 and 824. The memory device 83 may provide an external current to wirings 881 and 882 that are coupled to the electrical device 85. The memory device 832 may further include switches 891 and 892. The switch 891 may connect the wiring 823 to the wiring 881, and the switch 892 may connect the wiring 824 to the wiring 882, respectively. In one embodiment, the command decoder 862 may control turning on and off of the switches 891 and 892.

In FIGS. 8A and 8B, the memory controller 84 may provide the command CMD1 to the memory device 831 being deselected (disabled) for substantial operation. The memory controller 84 may also provide the command CMD2 to the memory device 832 being selected for substantial operation. For example, the command CMD2 may be a refresh command REF instructing a refresh operation, a write command WR instructing a write operation, a read command RD instructing a read operation. The command CMD2 may also be a self-refresh command SREF instructing a self-refresh operation. In some embodiments, a refresh operation, a write operation or a read operation may consume substantial power, whereas the self-refresh operation may consume relatively low power. The memory controller 84 may provide the self-refresh command SREF as the command CMD2 while providing the command CMD1 that instructs a relatively power consuming operation, such as the write command WR, the read command RD, or the refresh operation REF as shown in FIG. 8B. On the other hand, the memory controller 84 may provide the refresh command as the command CMD2 While providing the command CMD1 that instructs a low power consuming operation, such as the self-refresh command SREF.

In the memory device 831, the command decoder 861 may receive the first command CMD1, and responsive to the first command CMD1, the command decoder 861 may control the internal circuits to execute an operation indicated in the first command CMD1. While the CMD1 is indicative of the memory device 831 being selected, the command decoder 861 may further provide a control signal in an inactive state (CTRL OFF) to the switches 871 and 872. Responsive to the control signal in the inactive state, the switch 871 may disconnect the wiring 821 from the wiring 823, and the switch 872 may disconnect the wiring 822 from the wiring 824, respectively. The internal current from the power source 81 may be consumed within the memory device 831. While the CMD1 is indicative of the memory device 831 being deselected, the command decoder 861 may further provide a control signal in an active state (CTRL ON) to the switches 871 and 872. Responsive to the control signal in the active state, the switch 871 may connect the wiring 821 to the wiring 823, and the switch 872 may connect the wiring 822 to the wiring 824, respectively. Thus, the internal current from the power source 81 on the wirings 821 and 822 may be further provided as an external current on the wirings 823 and 824 to the memory device 832.

For example, if the command CMD1 is the self-refresh command, the memory device 831 may control the circuits in a manner to self-refresh bit lines. Simultaneously, responsive to the command CMD2 being and the command CMD2 is either the refresh command REF, the write command WR or the read command RD, the command decoder 862 may operate the refresh, write or read operation which consumes substantial power. Thus, the power provided from the power source 81 may be used for the low power consuming operations in the memory device 831, such as the self-refresh, as well as for operations which may consume more power executed by the memory device 832. In the memory device 832, the command decoder 862 may receive the second command CMD2, and responsive to the second command CMD2, the command decoder 862 may control the internal circuits, such as a row decoder (not shown) and a column decoder (not shown) to execute an operation indicated in the second command CMD2. For example, the row decoder may activate a row to be accessed, such as to be read or to be written, by driving a word line corresponding to the row to a high voltage level. Simultaneously, responsive to the second command CMD2, the command decoder 862 may further provide the control signal in an inactive state (CTRL OFF) to the switches 891 and 892. Responsive to the control signal in the inactive state, the switch 891 may disconnect the wiring 881 from the wiring 823, and the switch 892 may disconnect the wiring 882 from the wiring 824, respectively. Thus, the power provided as the internal current from the memory device 831 to the memory device 832 via the wirings 823 and 824 may be consumed for the operations in the memory device 832, such as the refresh, read or write operations; however the external current may not be provided to the electrical device 85. In this manner, the command decoder 862 may disable providing the external current to the electrical device 85 responsive to the second command CMD2.

When the memory controller 84 may provide a self-refresh command SREF as the command CMD2 to the memory device 832, the memory device 832 operates a low power consumption operation, such as a self-refresh operation, while being selected (enabled). The memory controller 84 may provide the command CMD1 with higher power consumption, such as the refresh command to the memory device 831 and the memory device 831 may operate the refresh operation. In addition, responsive to the self-refresh command SREF, the command decoder 862 may further provide a control signal in an active state (CTRL ON) to the switches 871 and 872. Responsive to the control signal in the active state, the switch 891 may connect the wiring 881 to the wiring 823, and the switch 892 may connect the wiring 882 to the wiring 824, respectively. Thus, the power provided as the internal current from the memory device 831 to the memory device 832 via the wirings 823 and 824 may be provided to the electrical device 85.

In the manner described above, the command decoders 861 and 862 may enable or disable providing the current from the power source 81 to the memory device 832 and the electrical device 85 responsive to the first command CMD1 and the second command CMD2 from the memory controller 84 indicating a combination of higher and lower power consumption operations. As a result, the internal current may be maintained stable, without substantial fluctuation, across each memory device's statuses, such as being selected and deselected.

From the foregoing it will be appreciated that, although specific embodiments of the invention have been described herein for purposes of illustration, various modifications may be made without deviating from the spirit and scope of the invention. For example, while embodiments have been described with respect to providing power from a semiconductor chip in a personal computer such as a desktop PC, a laptop PC, or a gaming PC, other embodiments may be directed to using a semiconductor chip as described herein in other devices including, but not limited to, any stationary devices such as game consoles, data storages, electronic accessary devices, and digital media players, any portable devices such as portable game devices, portable digital media players, cellular telephones, tablets, various embedded systems, and any combination or subcombination thereof. Accordingly, the invention is not limited except as by the appended claims.

What is claimed is:

1. An apparatus comprising:
a semiconductor device comprising a power node, the semiconductor device configured to receive power as an internal current, and further configured to operate in a first mode and a second mode,
wherein the semiconductor device is configured to consume more power in the second mode than in the first mode,
wherein the semiconductor device is configured to provide an external current at the power node during the first mode, the external current comprising a portion of the internal current, and
wherein the semiconductor device is further configured to not provide an external current at the power node during the second mode.

2. The apparatus of claim 1, further comprising:
a first wiring coupled to the semiconductor device;
a second wiring coupled to the power node of the semiconductor device,
wherein the semiconductor device is configured to receive the power from the first wiring as the internal current and the semiconductor device includes a switch configured to connect the second wiring to the power node in the first mode.

3. The apparatus of claim 2; further comprising:
a sensor configured to detect the first mode when the internal current is greater than a first threshold amount and further configured to detect the second mode when the internal current is less than a second threshold amount,
wherein the sensor is configured to provide a control signal indicative of the first mode to the switch, and
wherein the switch is configured to connect the second wiring to the power node responsive to the control signal indicative of the first mode from the sensor to provide the portion of the internal current to the second wiring at the power node.

4. The apparatus of claim 2, wherein the switch is configured to receive a control signal provided externally, and configured to couple the second wiring to the power node responsive to the control signal indicative of the first mode.

5. The apparatus of claim 2, wherein the semiconductor device is a memory device, the semiconductor device comprising:
a command decoder configured to receive a command, configured to decode the command, and further configured to control internal circuits according to an operation of the memory device instructed by the command,
wherein the command decoder is further configured to determine whether the operation is related to the first mode or the second mode, and configured to provide a control signal indicative of the determined mode to the switch, and
wherein the switch is configured to connect the second wiring to the power node responsive to the control signal indicative of the first mode.

6. The apparatus of claim 5, further comprising:
wherein the operation related to the first mode is one of a precharge operation and a self refresh operation, and
wherein the operation related to the second mode is one of a write operation and a read operation.

7. An apparatus comprising:
a semiconductor device comprising a power node, the semiconductor device configured to receive power as an internal current, and further configured to operate in a first mode and a second mode;
a wiring coupled to the semiconductor device; and
a second memory device configured to receive an external current from a first memory device, the second memory device including:
a second command decoder configured to receive a second command and decode the second command, and further configured to control internal circuits in the second memory device according to an operation of the memory device instructed by the second command,
wherein the semiconductor device is configured to consume more power in the second mode than in the first mode,
wherein the semiconductor device is configured to consume a first portion of the internal current and further configured to provide a second portion of the internal current as an external current at the power node during the first mode,
wherein the semiconductor device is further configured to consume a third portion of the internal current that is greater than the first portion of the internal current during the second mode,
wherein the semiconductor device is configured to receive the power from the wiring as the internal current and the semiconductor device includes a switch configured to connect the wiring to the power node in the first mode,
wherein the semiconductor device is a memory device, the semiconductor device comprising:
a command decoder configured to receive a command, configured to decode the command, and further configured to control internal circuits according to an operation of the memory device instructed by the command,
wherein the command decoder is further configured to determine whether the operation is related to the first mode or the second mode, and configured to provide a control signal indicative of the determined mode to the switch,
wherein the switch is configured to connect the wiring to the power node responsive to the control signal indicative of the first mode,
wherein the memory device is the first memory device, the command decoder is a first command decoder and the command is a first command, and
wherein the first command or the second command instructs a memory operation with high power consumption, and the second command or the first command instructs a memory operation with low power consumption, respectively.

8. An apparatus, comprising:
a power source configured to provide power;
a semiconductor device configured to receive the power from the power source as an internal current and further configured to operate in a first mode and a second mode; and
an electrical device configured to be coupled to the semiconductor device;
wherein the semiconductor device is further configured to provide at least a portion of the internal current as an external current to the electrical device during the first mode and not provide a portion of the internal current as an external current to the electrical device during the second mode.

9. The apparatus of claim 8, further comprising a power manager configured to enable providing the at least the portion of the internal current as the external current during the first mode, and further configured to disable providing at least the portion of the internal current as the external current during the second mode.

10. The apparatus of claim 9, wherein the power manager comprises a sensor included in the semiconductor device, the sensor configured to detect the first mode when the internal current is greater than a first threshold amount and further configured to detect the second mode when the internal current is less than a second threshold amount.

11. The apparatus of claim 9, wherein the semiconductor device is a memory device,
wherein the power manager comprises a command decoder included in the memory device, the command decoder configured to receive a command, configured to decode the command, and further configured to control internal circuits according to an operation of the memory device instructed by the command, and wherein the command decoder is further configured to determine whether the operation is related to the first mode or the second mode, and configured to provide a control signal indicative of the determined mode.

12. The apparatus of claim 9, wherein the semiconductor device is a memory device, wherein the power manager comprises a memory controller configured to provide a command to the memory device; the command indicative of an operation of the memory device, and wherein the memory controller is further configured to determine whether the operation is related to the first mode or the second mode, and configured to provide a control signal indicative of the determined mode.

13. An apparatus comprising:

a power source configured to provide power;

a semiconductor device configured to receive the power from the power source as an internal current and further configured to operate in a first mode and a second mode;

an electrical device configured to be coupled to the semiconductor device, wherein the semiconductor device is further configured to provide at least a portion of the internal current as an external current to the electrical device during the first mode;

a power manager configured to enable providing the at least the portion of the internal current as the external current during the first mode, and further configured to disable providing at least the portion of the internal current as the external current during the second mode;

a first wiring having a first end coupled to the power source and a second end coupled to the semiconductor device;

a second wiring having a third end coupled to the electrical device; and a switch configured to connect the first wiring to the second wiring and further configured to disconnect the first wiring from the second wiring, wherein the power manager is configured to provide a control signal related to the first mode during the first mode and is further configured to provide the control signal related to the second mode during the second mode, and wherein the switch is configured to connect the first wiring to the second wiring responsive to the control signal indicative of the first mode, and is further configured to disconnect the first wiring from the second wiring responsive to the control signal indicative of the second mode.

14. The apparatus of claim 13, further comprising:

a second power source and wherein the power source comprises a first power source; and a third wiring having a fourth end coupled to the second power source;

wherein the switch is further configured to couple the third wiring to the second wiring responsive to the control signal related to the second mode.

15. The apparatus of claim 13, wherein the electrical device comprises an energy storage.

16. The apparatus of claim 15, wherein the switch comprises a current controller configured to couple the first wiring to the second wiring in order to provide at least a portion of the internal current on the first wiring as the external current on the second wiring responsive to the control signal related to the first mode, and is further configured to provide the external current on the second wiring as the internal current on the first wiring responsive to the control signal related to a third mode different from the first and second modes.

17. A method comprising:

receiving power from a power source as an internal current by a semiconductor device;

operating the semiconductor device in a first mode and a second mode; and during the first mode, providing at least a portion of the internal current as an external current to an electrical device configured to be coupled to the semiconductor device, and during the second mode, not providing a portion of the internal current as an external current to the electrical device.

18. The method of claim 17, further comprising:

detecting the first mode when the internal current is greater than a first threshold amount; and detecting the second mode when the internal current is less than a second threshold amount.

19. The method of claim 17, further comprising:

receiving a command;

decoding the command;

controlling internal circuits according to an operation instructed by the command;

determining whether the operation instructed by the command is related to the first mode or the second mode, and;

providing a control signal indicative of the determined mode.

20. The method of claim 19, wherein the semiconductor device comprises a memory device including a command decoder, and wherein determining and providing the control signal are executed by the command decoder.

21. The method of claim 19, wherein the semiconductor device comprises a memory device and a memory controller is coupled to the memory device, and wherein determining and providing the control signal are executed by the memory controller.

22. The method of claim 19, further comprising:

receiving a status from the semiconductor device;

determining whether the status is related to the first mode or the second mode, and;

providing a control signal indicative of the determined mode.

* * * * *